(12) United States Patent
Kimura (10) Patent No.: US 8,535,767 B1
(45) Date of Patent: Sep. 17, 2013

(54) METHOD FOR REPAIRING DAMAGE OF DIELECTRIC FILM BY HYDROCARBON RESTORATION AND HYDROCARBON DEPLETION USING UV IRRADIATION

(75) Inventor: Yosuke Kimura, Hachioji (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 13/450,368

(22) Filed: Apr. 18, 2012

(51) Int. Cl.
  *B05D 3/00* (2006.01)
  *B05D 3/06* (2006.01)
  *C23C 16/48* (2006.01)
  *H01L 21/00* (2006.01)

(52) U.S. Cl.
  USPC ............. 427/553; 427/558; 427/582; 438/4

(58) Field of Classification Search
  None
  See application file for complete search history.

(56) References Cited

U.S. PATENT DOCUMENTS

| | | | | |
|---|---|---|---|---|
| 7,851,232 | B2 * | 12/2010 | van Schravendijk et al. | 438/4 |
| 2008/0199977 | A1 * | 8/2008 | Weigel et al. | 438/4 |
| 2010/0151206 | A1 * | 6/2010 | Wu et al. | 428/158 |
| 2011/0159202 | A1 | 6/2011 | Matsushita | |
| 2012/0270339 | A1 * | 10/2012 | Xie et al. | 438/4 |

* cited by examiner

*Primary Examiner* — Timothy Meeks
*Assistant Examiner* — Ina Agaj
(74) *Attorney, Agent, or Firm* — Snell & Wilmer L.L.P.

(57) ABSTRACT

A method for repairing process-related damage of a dielectric film formed on a substrate caused by processing the dielectric film includes: irradiating the damaged dielectric film with UV light in an atmosphere of hydrocarbon-containing gas to restore the surface of the dielectric film; and irradiating the surface-restored dielectric film with UV light in an atmosphere of oxygen gas to partially remove the hydrocarbon film.

17 Claims, 5 Drawing Sheets

METHOD FOR REPAIRING DAMAGE OF DIELECTRIC FILM BY HYDROCARBON RESTORATION AND HYDROCARBON DEPLETION USING UV IRRADIATION

BACKGROUND

1. Field of the Invention

The present invention generally relates to a method for repairing process-related damage of a dielectric film by hydrocarbon restoration and hydrocarbon depletion using UV irradiation.

2. Description of the Related Art

Dielectric films are indispensable to increasing processing speed of semiconductor devices and lowering power consumption of the devices. The dielectric films are susceptible to damage during their manufacturing processes, thereby increasing dielectric constants and/or leakage currents. Such process-related damage includes damage caused by dry etching and plasma ashing, and washing with chemicals, and physical damage by chemical mechanical planarization (CMP), etc. In order to repair such process-related damage of the dielectric films, U.S. Pat. No. 7,851,232 and U.S. Patent Application Publication No. 2011/0159202 (U.S. Pub, '202), for example, disclose repairing damage by UV-excited reaction using a gas containing carbon. However, although damaged surfaces can be restored to a certain degree by the above methods using a hydrocarbon film (U.S. Pub. '202), restoration is insufficient depending on the degree of damage. A hydrocarbon film can restore the damaged surfaces (e.g., porous surfaces) by sealing pores, and depending on the degree of damage, by further forming a protective film (U.S. Pub. '202). However, restoration by sealing pores and forming a protective film has limited effect, and even if the duration of the above restoration is extended, such an extended process provides more carbon to the damaged surface and increases a thickness of the protective hydrocarbon layer, but does not sufficiently repair the damaged layer. For example, after the restoration by UV irradiation with a hydrocarbon gas, a dielectric constant recovery rate, R, of the restored dielectric film is about 70% at most (for example, see the Examples discussed later), wherein $R=(\in 1 \in^*)/(\in 1-\in 0) \times 100$ where $\in 0$ is the dielectric constant of the dielectric film prior to the damage exerted thereto, $\in 1$ is the dielectric constant of the damaged dielectric film, and $\in^*$ is the dielectric constant of the restored dielectric film.

Any discussion of problems and solutions involved in the related art has been included in this disclosure solely for the purposes of providing a context for the present invention, and should not be taken as an admission that any or all of the discussion were known at the time the invention was made.

SUMMARY

In some embodiments of the present invention, after restoration of the damaged dielectric film by UV irradiation with a hydrocarbon gas, a hydrocarbon depletion process is conducted using UV irradiation with an oxygen gas. Surprisingly, by removing excess hydrocarbon film deposited on the damaged surface using excited oxygen, the damaged surface can further be repaired, e.g., the dielectric constant recovery rate can be increased by at least 10 percentage points.

According to some embodiments of the present invention, a method for repairing process-related damage of a dielectric film formed on a substrate caused by processing the dielectric film is provided, wherein the damaged dielectric film has a first carbon content and a first dielectric constant. In some embodiments, the method comprises: (i) irradiating the damaged dielectric film with UV light in an atmosphere of hydrocarbon-containing gas to react a surface of the damaged dielectric film with activated carbons, thereby restoring the surface with a hydrocarbon film, wherein the surface-restored dielectric film has a second carbon content which is higher than the first carbon content, and a second dielectric constant which is lower than the first dielectric constant; and (ii) irradiating the surface-restored dielectric film with UV light in an atmosphere of oxygen gas to partially remove the hydrocarbon film, thereby further repairing the damaged dielectric film, wherein the hydrocarbon-depleted dielectric film has a third carbon content which is lower than the second carbon content, and a third dielectric constant which is lower than the second dielectric constant.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are oversimplified for illustrative purposes and are not necessarily to scale.

DETAILED DESCRIPTION

In this disclosure, a "gas" may include vaporized solid and/or liquid and may be constituted by a single gas or a mixture of gases. Gases can be supplied in sequence with or without overlap. In some embodiments, a "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. In this disclosure, "a" refers to a species or a genus including multiple species. Further, in this disclosure, any two numbers of a variable can constitute an applicable range of the variable, and any ranges indicated may include or exclude the endpoints. Further, the numbers include approximate numbers, and may refer to average, median, representative, majority, etc. in some embodiments. In this disclosure, any defined meanings do not necessarily exclude ordinary and customary meanings in some embodiments.

In the present disclosure where conditions and/or structures are not specified, the skilled artisan in the art can readily provide such conditions and/or structures, in view of the present disclosure, as a matter of routine experimentation.

In some embodiments, a method for repairing process-related damage of a dielectric film formed on a substrate caused by processing the dielectric film is provided, wherein the damaged dielectric film has a first carbon content and a first dielectric constant. The process-related damage of a dielectric film may be any damage caused by processing the dielectric film, such as plasma ashing, plasma etching, wet and dry cleaning, etc., resulting in a substantial increase of SiO, SiCO, SiN, SiCN, or other silicon-based multi-element materials, f dielectric constant of the dielectric film. The "substantial increase" refers to at least 10%, 20%, or 30%, in some embodiments. Typically, the damaged surface of the dielectric film develops numerous pores, and is terminated by OH groups. The dielectric film includes, but is not limited to, low-k films constituted by SiC, or boron-based multi-element materials such as borozine, or multi-element hydrocarbon materials, etc., having a dielectric constant of about 1.9 to 5.0, typically about 2.1 to 3.0, preferably less than 2.5. In some embodiments, the dielectric film is formed in trenches or vias including side walls and bottom surfaces, and/or flat surfaces, by plasma-enhanced CVD, thermal CVD, cyclic CVD, plasma-enhanced ALD, thermal ALD, radical-enhanced ALD, or any other thin film deposition methods. Typically, the thickness of the dielectric film is in a range of about 50 nm to about 500 nm (a desired film thickness can be selected as deemed appropriate according to the application and purpose of film, etc.).

In some embodiments, the dielectric film is a porous low-k film or extreme low-k film (ELK film) having properties shown in Table 1 below.

TABLE 1

| | Porous Low-k film properties |
|---|---|
| Dielectric constant (k) | ≦k2.3 |
| Refractive index (at 633 nm) | ≦1.31 |
| Porosity (%) | ≧30% |
| Pore diameter (nm) | ≧1.4 nm |
| Elastic modulus (GPa) | ≦5.9 GPa |

When the dielectric film receives damage by ashing or etching, a restoration step is conducted as a first repair step. In some embodiments, the first repair step is the step of irradiating the damaged dielectric film with UV light in an atmosphere of hydrocarbon-containing gas to react a surface of the damaged dielectric film with activated carbons, thereby obtaining a "surface-restored dielectric film". This step may be referred to as a "hydrocarbon restoration step". The surface-restored dielectric film has a second carbon content which is higher (e.g., substantially higher, e.g., by at least about 20%, 30%, or 40%) than the first carbon content of the dielectric film, and a second dielectric constant which is lower (e.g., substantially lower, e.g., by at least about 5%, 10%, or 15%) than the first dielectric constant of the dielectric film. The above step may be referred to also as a "pore-sealing step" since activated carbons seal pores created on the damaged surface. In the above, the carbon content can be measured by FT-IR spectroscopy and defined as an area including a peak in a wavelength range of about 2840-3040 $cm^{-1}$ or by any suitable equivalent methods. A beam of infrared light penetrates a film having a thickness of about 100 nm to about 200 nm in FT-IR spectroscopy, and thus, the carbon content of the dielectric film refers to a carbon content of the film having such a thickness (or equivalents thereto) including a hydrocarbon film formed thereon in the hydrocarbon restoration step. The dielectric constant of the dielectric film refers to a dielectric constant of a layer having a thickness of, e.g., about 200 nm (or equivalents thereto) as a standard. However, it is confirmed that dielectric constants of layers having a thickness of about 100 nm to about 500 nm are not substantially different from that of a layer having a thickness of about 200 nm.

In some embodiments, the step of sealing the pores is performed to restore a surface layer of the substrate and then form a hydrocarbon film (pore-sealing film or protective film) thereon having a thickness of at least about 0.1 nm, in some embodiments, at least about 0.5 nm or at least about 1.0 nm, but less than about 10 nm.

Types of hydrocarbon gases that can be used in the hydrocarbon restoration step include, for example, CxHy gas (x=1 to 15, y=2x or 2x+2, such as styrene monomer, butadiene, etc.), or mixed gas constituted by CxHy and N2 or other inert gas, among others. Preferably, the hydrocarbon gas is a gas containing a carbon double or triple bond in its molecule, such as butadiene. In some embodiments, a CH-containing reaction gas (not including Si-containing gas) is selected primarily because it allows for easy cleaning of products attached to the inside of the reactor after the film has been formed. In some embodiments, the atmosphere of hydrocarbon-containing gas for the hydrocarbon restoration step is oxygen-free.

In some embodiments, in the hydrocarbon restoration step, the hydrocarbon film deposition conditions shown in Table 2 are used.

TABLE 2

| | UV irradiation/polymerization (hydrocarbon restoration) |
|---|---|
| UV wavelength (nm) | >200 nm (preferable 200 to 600 nm) |
| UV power (W/$cm^2$) | 10 to 400 mW/$cm^2$ (preferably 50 to 200 mW/$cm^2$) |
| Duration (sec): | 20 to 600 see (preferably 30 to 300 sec) |
| Supply time of hydrocarbon gas | |
| Substrate temperature (° C.) | 100 to 450° C. (preferably 200 to 300° C.) |
| Pressure (Torr) | 0 to 760 Torr (preferably 1 to 10 Torr) |
| Flow rate of hydrocarbon gas (sccm) | 5 to 1,000 sccm (preferably 10 to 100 sccm) |
| Type of carrier gas | $N_2$, He, Ar |
| Flow rate of carrier gas including reaction gas (sccm) | 100 to 10,000 sccm (preferably 100 to 2000 sccm) |

(the numbers are approximate)

Types of lamps that can be used to irradiate UV light include, for example, a high-pressure mercury lamp, low-pressure mercury lamp, xenon excimer lamp and metal halide lamp.

Illumination intensity, heater temperature, gas flow rate, mixing ratio and deposition time are among the parameters used to control the thickness and quality of hydrocarbon film, and the film thickness and film quality can be controlled by changing these parameters. In hydrocarbon film deposition, the deposition rate can be controlled even with a thin film.

In some embodiments, some conditions for the UV step disclosed in U.S. Patent Application Publication No. 2011/0159202 can be used for the hydrocarbon restoration step, the disclosure of which is herein incorporated by reference in its entirety.

Figure 2:
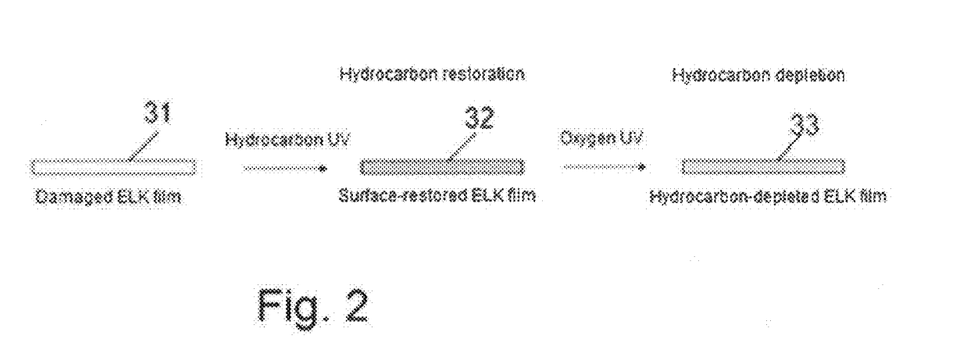
FIG. 2 is a schematic view showing a repair process according to an embodiment of the present invention.

FIG. 2 is a schematic view showing a repair process according to an embodiment of the present invention. A substrate 31 with a damaged porous low-k film or extreme low-k film (ELK film) is subjected to the hydrocarbon restoration step using UV irradiation in an atmosphere of a hydrocarbon gas having double or triple carbon bonds, such as butadiene gas, thereby obtaining a substrate 32 with a surface-restored ELK film. However, in some embodiments, in the hydrocarbon restoration step, a dielectric constant recovery rate, R, of the restored dielectric film does not exceed 80% even if the duration of the step is prolonged, wherein $R=\in1-\in2/(\in1-\in0)\times100$ where $\in0$ is the dielectric constant of the dielectric film prior to the damage exerted thereto, $\in1$ is the dielectric constant of the damaged dielectric film, and $\in2$ is the dielectric constant of the restored dielectric film.

In some embodiments, the hydrocarbon restoration step comprises: placing a substrate with a damaged dielectric film formed thereon in a reactor; transmitting UV light through a transmission glass to the reactor; supplying a mixture gas of hydrocarbon gas such as butadiene and nitrogen gas to the reactor; treating the surface of the substrate with UV light in the atmosphere to restore the damaged dielectric film; and cleaning the inside of the reactor and the transmission glass.

In some embodiments, the second repair step is the step of irradiating the surface-restored dielectric film with UV light in an atmosphere of oxygen gas to partially remove the hydrocarbon film, thereby further repairing the damaged dielectric film to obtain a "hydrocarbon film-depleted dielectric film," wherein the hydrocarbon film-depleted dielectric film has a third carbon content which is lower (e.g., substantially lower, e.g., by at least about 10%, 20%, or 30%) than the second carbon content of the surface-restored dielectric film, and a third dielectric constant which is lower (e.g., substantially lower, e.g., by at least about 2%, 3%, or 5%) than the second dielectric constant of the surface-restored dielectric film. This step may be referred to as a "hydrocarbon depletion step" (also referred to as a "UV-oxygen cure step"). In FIG. 2, in the hydrocarbon depletion step, a substrate 33 with a hydrocarbon film-depleted ELK film is obtained. Surprisingly, by depleting a hydrocarbon film from the surface-restored dielectric film after sealing pores and forming a hydrocarbon film on the damaged surface of the dielectric film, the damaged layer can further be repaired. By the hydrocarbon depletion step, —OH groups which still remain on the surface after the hydrocarbon restoration step can further be removed, and excess hydrocarbon film can be removed, thereby restoring the degraded dielectric constant of the damaged dielectric film.

In some embodiments, the step of irradiating the surface-restored dielectric film with UV light in an atmosphere of oxygen gas continues to provide a dielectric constant recovery rate, R, of the hydrocarbon film-depleted dielectric film of at least 80% (e.g., at least 85%, at least 90%, or at least 95%), wherein $R=(\in1-\in3)/(\in1-\in0)\times100$ where $\in0$ is a dielectric constant of the dielectric film prior to the damage exerted thereto, $\in1$ is the first dielectric constant, and $\in3$ is the third dielectric constant. In some embodiments, the dielectric constant recovery rate of the hydrocarbon film-depleted dielectric film is higher than a dielectric constant recovery ratio of the surface-restored dielectric film by at least 10 percentage points (e.g., at least 15 percentage points, at least 20 percentage points).

In some embodiments, the step of irradiating the surface-restored dielectric film with UV light in an atmosphere of oxygen gas continues to render the third carbon content of the hydrocarbon film-depleted dielectric film equivalent (e.g., the difference is less than about 8%, less than about 5%, or less than about 3%) to the first carbon content of the dielectric film prior to the damage exerted thereon. In some embodiments, the step of irradiating the surface-restored dielectric film with UV light continues to render the third carbon content substantially the same (e.g., the difference is less than about 5%, less than 3%, or less than about 1%) as that of the dielectric film prior to the damage exerted thereto. In some embodiments, by the hydrocarbon depletion step, the hydrocarbon film deposited in the hydrocarbon restoration step is substantially removed. In some embodiments, after the hydrocarbon depletion step, the thickness of the hydrocarbon film is less than about 1 nm, less than about 0.5 nm, or less than about 0.1 nm.

In some embodiments, the atmosphere of oxygen gas is hydrocarbon-free. In some embodiments, the atmosphere of oxygen gas is constituted by supplying an oxygen gas at a flow rate of more than 0 sccm but less than about 50 sccm (e.g., about 1 sccm to about 10 sccm). In some embodiments, the oxygen gas is oxygen, ozone, or nitrogen oxide. In some embodiments, the atmosphere of oxygen gas is constituted by supplying a mixture of an inert gas and an oxygen gas at a flow rate of 500 sccm to 10,000 sccm (e.g., about 1,000 sccm to about 5,000 sccm), wherein the concentration of oxygen gas in the mixture is about 100 ppm to about 2,000 ppm (e.g., about 300 ppm to about 1,000 ppm).

In some embodiments, the step of irradiating the surface-restored dielectric film with UV light is conducted while supplying an oxygen gas for about 30 seconds to about 300 seconds (including about 60 seconds to about 180 seconds). In some embodiments, the duration of hydrocarbon depletion is shorter (e.g., by 10% to 50%) than that of hydrocarbon restoration. Alternatively, the duration of hydrocarbon depletion is longer (e.g., by 10% to 50%) than that of hydrocarbon restoration. In some embodiments, the step of irradiating the surface-restored dielectric film with UV light in an atmosphere of oxygen gas is conducted at a temperature (e.g., about 100° C. to about 450° C., typically about 200° C. to 400° C.) which is higher (e.g., by about 20° C. to about 200° C., typically about 50° C. to about 150° C.) than that for the step of irradiating the damaged dielectric film with UV light in an atmosphere of hydrocarbon-containing gas.

In some embodiments, in the hydrocarbon depletion step, the hydrocarbon depletion conditions shown in Table 3 are used.

TABLE 3

| | UV irradiation/hydrocarbon depletion |
|---|---|
| UV wavelength (nm) | >200 nm (preferably 200 to 600 nm) |
| UV power (W/cm$^2$) | 10 to 400 mW/cm$^2$ (preferably 50 to 200 mW/cm$^2$) |
| Duration (sec): Supply time of oxygen gas | 5 to 600 sec (preferably 30 to 300 sec) |
| Substrate temperature (° C.) | 100 to 450° C. (preferably 200 to 400° C.) |
| Pressure (Torr) | 0 to 760 Torr (preferably 1 to 10 Torr) |
| Flow rate of oxygen gas (sccm) | 0.1 to 50 sccm (preferably 1 to 20 sccm) |

TABLE 3-continued

| | UV irradiation/hydrocarbon depletion |
|---|---|
| Oxygen gas | Oxygen, Ozone, Nitrogen oxide (preferably oxygen) |
| Type of carrier gas | $N_2$, He, Ar |
| Flow rate of carrier gas including reaction gas (sccm) | 500 to 10,000 sccm (preferably 1,000 to 5,000 sccm) |

(the numbers are approximate)

Types of lamps that can be used to irradiate UV light include, for example, a high-pressure mercury lamp, low-pressure mercury lamp, xenon excimer lamp and metal halide lamp.

Illumination intensity, heater temperature, gas flow rate, mixing ratio and deposition time are among the parameters used to control the thickness and quality of hydrocarbon film, and the film thickness and film quality can be controlled by changing these parameters.

In some embodiments, the hydrocarbon depletion step comprises: placing a substrate with a surface-restored dielectric film formed thereon in a reactor; transmitting UV light through a transmission glass to the reactor; supplying a mixture gas of oxygen gas and nitrogen gas to the reactor; treating the surface of the substrate with UV light in the atmosphere to deplete hydrocarbon film from the restored dielectric film; and cleaning the inside of the reactor and the transmission glass.

In some embodiments, the hydrocarbon restoration step and the hydrocarbon depletion step are separate and discrete steps, e.g., between which a vacuum in the reactor is broken, a substrate is transferred out and transferred in from/to the reactor, a reactor cleaning step intervenes, or a substrate is transferred to another reactor, although the hydrocarbon restoration and hydrocarbon depletion steps are performed in this order. Alternatively, these two steps are continuously performed in the same reactor, wherein "continuously" refers to without breaking a vacuum, without interruption as a timeline, without changing treatment conditions, or immediately thereafter.

Figure 5:
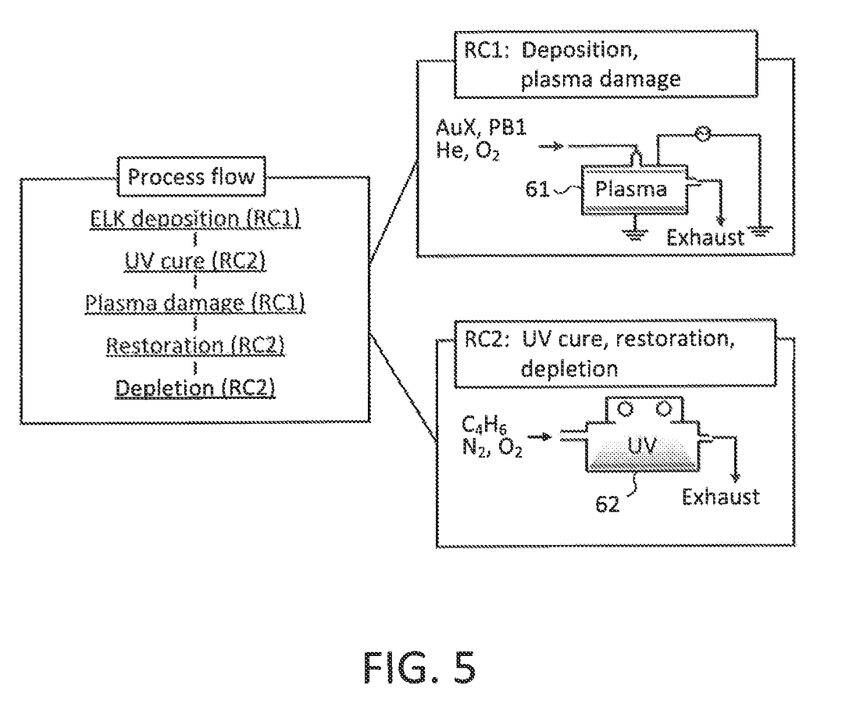
FIG. 5 is a schematic diagram showing the process flow and the processes conducted in reaction chambers (RC1, RC2) according to an embodiment of the present invention.

FIG. 5 is a schematic diagram showing the process flow and the processes conducted in reaction chambers (RC1, RC2) according to an embodiment of the present invention. First, a film is deposited on a substrate by plasma enhanced CVD in a reactor 61 (RC1) using, e.g., Aurora® X (diethoxymethylsilane; ASM International N.V.) and Pore Builder™ (hydrocarbon for atom transfer radical polymerization; ASM International N.V.), He, and $O_2$. Next, the substrate is transferred to a reactor 62 (RC2) for UV cure to obtain a porous low-k (ELK) film having a dielectric constant of, e.g., 2.3. This ELK film is then exposed to a plasma in RC1 to form a pattern by etching using a gas such as a mixture of $O_2$ and He, causing plasma damage to the ELK film. The damaged ELK film is then transferred to RC2 for UV pore sealing and restoration (hydrocarbon restoration) using a hydrocarbon gas such as butadiene and an inert gas such as $N_2$. The restored ELK film is then subjected to additional UV-oxygen cure (hydrocarbon depletion) in RC2 using an oxygen gas such as $O_2$ and an inert gas such as $N_2$.

In some embodiments, the porous low-k film is etched and wiring grooves are patterned, after which areas damaged by processing in the previous stage are repaired by means of UV film deposition (hydrocarbon restoration), thereby forming a pore-seal/protective film (hydrocarbon film) of approx. 1 to 2 nm in thickness over the side walls of the low-k film, and thereafter, the hydrocarbon film is depleted by UV-oxygen cure (hydrocarbon depletion). This way, the low-k film can effectively be protected against damage in the subsequent etching step for etching stopper film and also against plasma damage due to Cu reduction, etc., while preventing the barrier metal from diffusion.

In the present disclosure where conditions and/or structures are not specified, the skilled artisan in the art can readily provide such conditions and/or structures, in view of the present disclosure, as a matter of routine experimentation. Also, in the present disclosure, the numerical values applied in specific embodiments can be modified by a range of at least ±50% in other embodiments, and the ranges applied in embodiments may include or exclude the endpoints.

EXAMPLES

Figure 1:
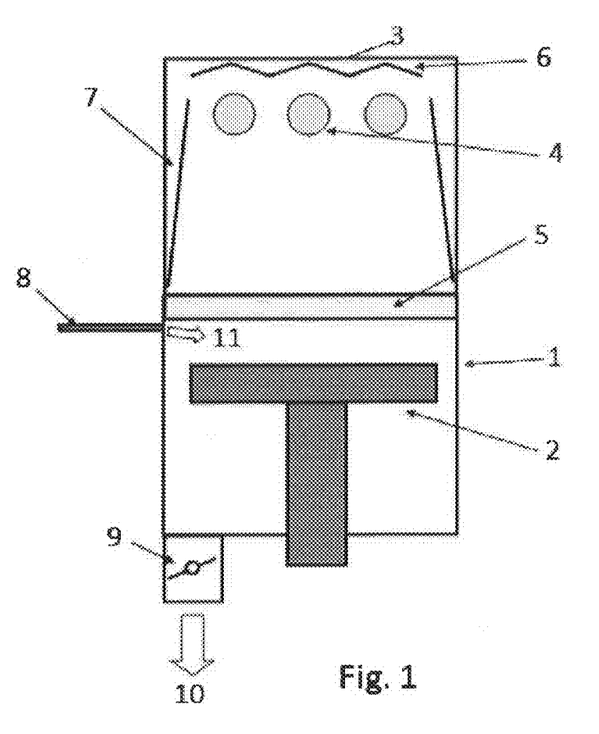
FIG. 1 is a schematic view of a UV system usable in an embodiment of the present invention.

In this example, the apparatus shown in the schematic diagram of FIG. 1 was used to form a film.

As shown in FIG. 1, the UV irradiation apparatus used in this example comprises a UV lamp unit 3, UV transmission glass 5, vacuum reactor 1, heater table 2, process gas inlet tube 8, process gas inlet port 11, vacuum pump 10, and pressure control valve 9. The UV lamp unit 3 has UV mirrors 6, 7 for efficient irradiation of UV light. Note that multiple process gas inlet ports may be provided at roughly an equal pitch along the inner periphery walls of the reactor to allow gas to be introduced toward the center from the inner periphery walls of the reactor.

Note that the present invention is not at all limited to the apparatus shown in this figure and any other apparatus can be used so long as it can irradiate UV light. The apparatus shown comprises a chamber that can be controlled to pressures from vacuum to around atmospheric pressure, and a UV irradiation unit provided at the top of the chamber.

This apparatus is explained further with reference to FIG. 1. The apparatus shown in FIG. 1 comprises UV emitters that emit light continuously and in a pulsed manner, a heater installed in a manner opposed to and in parallel with the emitters, and a transmission glass lying between the UV emitters and heater in a manner opposed to and in parallel with them. The transmission glass is provided to achieve uniform UV irradiation and may be made of any material, such as synthetic quartz, capable of isolating the reactor from the atmosphere but letting UV light pass through it. The UV emitters in the UV irradiation unit are multiple units of tube shape that are arranged in parallel with one another, where, as shown in FIG. 1, these emitters are arranged in an appropriate manner to achieve their purpose of ensuring uniform irradiation, while a reflector (umbrella-shaped piece on top of the UV lamp) is provided to have the UV light from each UV emitter reflect properly on the thin film, with the angle of this reflector made adjustable to achieve uniform irradiation. In this apparatus, the chamber that can be controlled to pressures from vacuum to around atmospheric pressure, and the UV emitters installed in the chamber and emitting light continuously and in a pulsed manner, are separated as the substrate processing part and UV emission part via the flange with the transmission glass. The UV emitters are structured in such a way that they can be replaced with ease.

Method of Experiment

The following experiments were conducted using the apparatus shown in FIG. 1 and the sequence illustrated in FIG. 5

1) A Si substrate (300 mm in diameter) was placed in a plasma enhanced CVD reactor and a siloxane polymer film was formed on the substrate using Aurora® X (diethoxymethylsilane; ASM International N.V.) and Pore Builder™ (hydrocarbon for atom transfer radical polymerization; ASM International N.V.), He, and O2 under the conditions shown in Table 4 below.

TABLE 4

|  | ELK k2.3 deposition condition |
| --- | --- |
| RF frequency (MHz) | 13.56 MHz |
| HRF (W) | 1100 W |
| Deposition time (sec) | 67 sec |
| SUS-Wall-SHD temperature (° C.) | 250-165-185° C. |
| Pressure (Pa) | 700 Pa |
| AuX (g/min) | 0.63 g/min |
| PB1 (g/min) | 1.60 g/min |
| He (sccm) | 750 sccm |
| O2 (sccm) | 25 sccm |
| GAP (mm) | 8 mm |

2) The substrate with the siloxane polymer film was transferred to the UV reactor and subjected to UV cure under the conditions shown in Table 5 below, thereby obtaining an ELK film having a dielectric constant of 2.3 and a thickness of 200 nm.

TABLE 5

|  | ELK k2.3 cure condition |
| --- | --- |
| UV wavelength (nm) | >200 nm (Hg Lamp) |
| UV power (W/cm$^2$) | 100 mW/cm$^2$ |
| Treatment time (sec) | 295 sec |
| Substrate temperature (° C.) | 400° C. |
| Pressure (Pa) | 666 Pa |
| N2 (sccm) | 4000 sccm |
| O2 (sccm) | 2 sccm |
| GAP (mm) | 25 mm |

3) Next, the substrate with the ELK film was transferred to the CVD reactor for plasma ashing or etching under the conditions shown in Table 6 below, thereby causing plasma damage to the ELK film.

TABLE 6

|  | Damage condition |
| --- | --- |
| RF frequency (MHz) | 13.56 MHz |
| HRF (W) | 60 W |
| Treatment time (sec) | 24 sec |
| Substrate temperature (° C.) | 250° C. |
| Pressure (Pa) | 466 Pa |
| He (sccm) | 2000 sccm |
| O2 (sccm) | 12 sccm |
| GAP (mm) | 8 mm |

4) Next, the substrate with the damaged ELK film was transferred to the UV reactor for pore-sealing and restoration (hydrocarbon restoration) using a mixture of a hydrocarbon gas ($C_4H_6$) and an inert gas ($N_2$) under the conditions shown in Table 7 below, thereby obtaining a surface-restored ELK film. After the hydrocarbon restoration, the substrate with the surface-restored ELK film was unloaded from the reactor and then the reactor was cleaned.

TABLE 7

|  | Restoration condition |
| --- | --- |
| UV wavelength (nm) | >200 nm (Hg Lamp) |
| UV power (W/cm$^2$) | 100 mW/cm$^2$ |
| Treatment time (sec) | 30-600 sec |

TABLE 7-continued

|  | Restoration condition |
| --- | --- |
| Substrate temperature (° C.) | 300° C. |
| Pressure (Pa) | 1100 Pa |
| N2 (sccm) | 500 sccm |
| C4H6 (sccm) | 38 sccm (He flow conversion) |
| GAP (mm) | 18 mm |

5) The substrate with the surface-restored ELK film was then reloaded to the UV reactor for additional UV cure (UV-oxygen cure or hydrocarbon depletion) using a mixture of an oxygen gas ($O_2$) and an inert gas ($N_2$) under the conditions shown in Table 8 below, thereby obtaining a hydrocarbon film-depleted ELK film. After the hydrocarbon depletion, the substrate with the hydrocarbon film-depleted ELK film was unloaded from the reactor and then the reactor was cleaned.

TABLE 8

|  | Post O2 cure condition |
| --- | --- |
| UV wavelength (nm) | >200 nm (Hg Lamp) |
| UV power (W/cm$^2$) | 100 mW/cm$^2$ |
| Treatment time (sec) | 30-300 sec |
| Substrate temperature (° C.) | 300° C. |
| Pressure (Pa) | 666 Pa |
| N2 (sccm) | 4000 sccm |
| O2 (sccm) | 2 sccm |
| GAP (mm) | 25 mm |

Results

Figure 4:
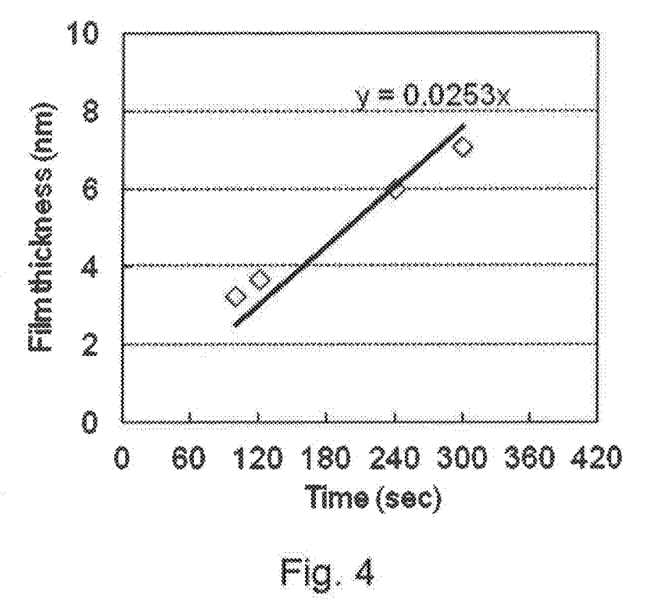
FIG. 4 shows the relationship between film thickness on a bare silicon wafer and process time of UV restoration according to an embodiment of the present invention.

FIG. 4 shows the relationship (partial) between film thickness (measured on a flat surface) and process time of UV hydrocarbon restoration when irradiating the damaged ELK film with UV light in the hydrocarbon atmosphere. The effect of the hydrocarbon restoration was expected to be sufficient at a process time of 30 seconds, i.e., a thickness of about 1 nm, since further deposition of a hydrocarbon film itself after restoring the damaged surface layer was not expected to improve the properties of the film.

Figure 3:
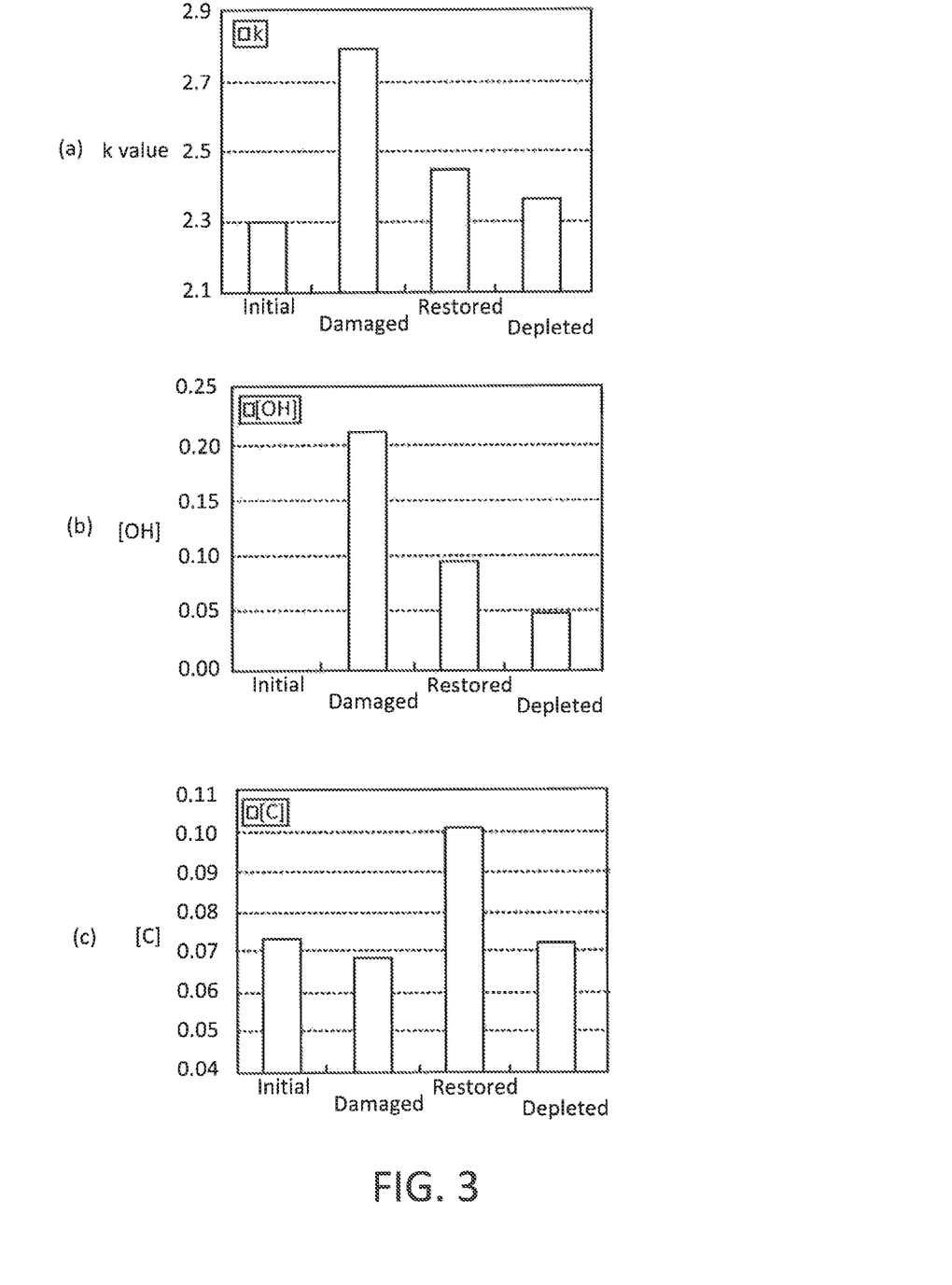
FIG. 3 shows: (a) dielectric constants, (b) OH group concentrations (arbitrary units), and (c) carbon concentrations (arbitrary units) of an initial low-k film, plasma-damaged film, hydrocarbon-restored film, and hydrocarbon-depleted film according to embodiments of the present invention.

FIG. 3 shows: (a) dielectric constants, (b) OH group concentrations (arbitrary units), and (c) carbon concentrations (arbitrary units) of the initial ELK film, the plasma-damaged ELK film, the hydrocarbon-restored ELK film (surface-restored film; treated for 240 seconds), and the hydrocarbon-depleted ELK film (UV-oxygen-cured film; treated for 120 seconds). In the above, the carbon content was measured by FT-IR spectroscopy and defined as an area including a peak in a wavelength range of about 2840-3040 cm$^{-1}$. The —OH group concentration was measured by FT-IR spectroscopy and defined as an area including a peak in a wavelength range of about 3100-3790 cm$^{-1}$.

As shown in (a) of FIG. 3, the plasma-damaged film had an increased dielectric constant which was 2.78, as compared with that of the initial film (2.3). As shown in (b) of FIG. 3, the —OH group concentration of the plasma-damaged film was significantly increased as compared with that of the initial film.

As shown in (c) of FIG. 3, the carbon concentration of the hydrocarbon-restored film was increased by about 50% as compared with that of the plasma-damaged film, while as shown in (b) of FIG. 3, the —OH group concentration of the hydrocarbon-restored film was decreased by about 50% as compared with that of the plasma-damaged film, indicating that hydrocarbon film replaced —OH groups and repaired the surface. As a result, as shown in (a) of FIG. 3, the dielectric constant of the hydrocarbon-restored film was decreased by about 12% (decreasing from 2.78 to 2.44). This means that a dielectric constant recovery rate of the hydrocarbon-restored film was about 71% ((2.78-2.44)/(2.78-2.3)).

As shown in (c) of FIG. 3, the carbon concentration of the hydrocarbon-depleted film was decreased by about 30% as compared with that of the hydrocarbon-restored film, while as shown in (b) of FIG. 3, the —OH group concentration of the hydrocarbon-depleted film was further decreased by about 50%/as compared with that of the hydrocarbon-restored film, indicating that the hydrocarbon depletion step could further remove —OH groups which remained inside the film after the hydrocarbon restoration step, and also could remove excess hydrocarbon film formed by the hydrocarbon restoration step. As a result, as shown in (a) of FIG. 3, the dielectric constant of the hydrocarbon-depleted film was further decreased by about 3% (decreasing from 2.44 to 2.36). This means that a dielectric constant recovery rate of the hydrocarbon-depleted film was about 88% ((2.78-2.36)/(2.78-2.3)). Also as shown in (c) of FIG. 3, by the hydrocarbon depletion step, the carbon content of the hydrocarbon-depleted film was decreased to a level substantially the same as that of the initial film prior to the plasma damage and the hydrocarbon restoration step. The carbon content of the hydrocarbon-depleted film was just slightly higher than that of the plasma-damaged film prior to the hydrocarbon restoration step, i.e., most of the hydrocarbon film deposited on the surface of the damaged film (except for the portion used for sealing pores) was expected to have been removed. It is surprising that even though most of the hydrocarbon film deposited on the surface of the damaged film was expected to have been removed, the dielectric constant of the hydrocarbon-depleted film was significantly improved.

It will be understood by those of skill in the art that numerous and various modifications can be made without departing from the spirit of the present invention. Therefore, it should be clearly understood that the forms of the present invention are illustrative only and are not intended to limit the scope of the present invention.

I claim:

1. A method for repairing process-related damage of a dielectric film formed on a substrate caused by processing the dielectric film, wherein the damaged dielectric film has a first carbon content and a first dielectric constant, comprising:

forming a hydrocarbon film on a surface of the damaged dielectric film by irradiating the damaged dielectric film with UV light in an atmosphere of hydrocarbon-containing gas to react the surface of the damaged dielectric film with activated carbon, thereby restoring the surface with the hydrocarbon film, said hydrocarbon film having a thickness of about 1 nm to about 10 nm and being a layer continuously extending in a direction perpendicular to a thickness direction substantially without pinholes to cover the surface of the damaged dielectric film, wherein the surface-restored dielectric film has a second carbon content which is higher than the first carbon content, and a second dielectric constant which is lower than the first dielectric constant; and partially removing the hydrocarbon film by irradiating the surface-restored dielectric film with UV light in an atmosphere of oxygen gas, resulting in a hydrocarbon-depleted film, thereby further repairing the damaged dielectric film, wherein the hydrocarbon-depleted dielectric film has a third carbon content which is lower than the second carbon content, and a third dielectric constant which is lower than the second dielectric constant.

2. The method according to claim 1, wherein the step of irradiating the surface-restored dielectric film with UV light in the atmosphere of oxygen gas renders the third carbon content equivalent to the first carbon content.

3. The method according to claim 1, wherein the step of irradiating the surface-restored dielectric film with UV light in the atmosphere of oxygen gas renders the third carbon content substantially the same as that of the dielectric film prior to the damage exerted thereto.

4. The method according to claim 1, wherein the atmosphere of hydrocarbon-containing gas is oxygen-free.

5. The method according to claim 1, wherein the atmosphere of oxygen gas is hydrocarbon-free.

6. The method according to claim 1, wherein the atmosphere of oxygen gas is constituted by supplying an oxygen gas at a flow rate of more than 0 sccm but less than about 50 sccm.

7. The method according to claim 6, wherein the oxygen gas is oxygen, ozone, or nitrogen oxide.

8. The method according to claim 1, wherein the atmosphere of hydrocarbon-containing gas is constituted by supplying a hydrocarbon gas at a flow rate of about 10 sccm to about 100 sccm.

9. The method according to claim 8, wherein the hydrocarbon gas is a gas containing a carbon double or triple bond in its molecule.

10. The method according to claim 1, wherein the atmosphere of oxygen gas is constituted by supplying a mixture of an inert gas and an oxygen gas at a flow rate of 500 seem to 10,000 sccm, wherein the concentration of oxygen gas in the mixture is about 100 ppm to about 1,000 ppm.

11. The method according to claim 1, wherein the damaged dielectric film is a dielectric film damaged by ashing or etching by a plasma.

12. The method according to claim 1, wherein the step of irradiating the damaged dielectric film with UV light in the atmosphere of hydrocarbon gas is conducted while supplying a hydrocarbon-containing gas for about 30 seconds to 600 seconds.

13. The method according to claim 1, wherein the step of irradiating the surface-restored dielectric film with UV light in the atmosphere of oxygen gas is conducted while supplying an oxygen gas for about 30 seconds to about 300 seconds.

14. The method according to claim 1, wherein the step of irradiating the surface-restored dielectric film with UV light in the atmosphere of oxygen gas continues to provide a dielectric constant recovery rate, R, of the hydrocarbon film-depleted dielectric film of at least 80%, wherein R=($\in$1–$\in$3)/($\in$1–$\in$0)×100 where $\in$0 is a dielectric constant of the dielectric film prior to the damage exerted thereto, $\in$1 is the first dielectric constant, and $\in$3 the third dielectric constant of the film.

15. The method according to claim 14, wherein the dielectric constant recovery rate of the hydrocarbon film-depleted dielectric film is higher than a dielectric constant recovery ratio of the surface-restored dielectric film by at least 10 percentage points, wherein the dielectric constant recovery ratio of the surface-restored dielectric film is expressed by R=($\in$1–$\in$2)($\in$1–$\in$0)×100 where $\in$2 is the second dielectric constant of the film.

16. The method according to claim 1, wherein the step of irradiating the damaged dielectric film with UV light in the atmosphere of hydrocarbon-containing gas and the step of irradiating the surface-restored dielectric film with UV light in the atmosphere of oxygen gas are discretely and separately conducted in the same reactor, between which a step of cleaning the reactor intervenes, or are conducted in different reactors.

17. The method according to claim 1, wherein the step of irradiating the damaged dielectric film with UV light in the atmosphere of hydrocarbon-containing gas and the step of irradiating the surface-restored dielectric film with UV light in the atmosphere of oxygen gas are continuously conducted in the same reactor.

\* \* \* \* \*